United States Patent [19]

Lyberg

[11] 4,048,581
[45] Sept. 13, 1977

[54] OSCILLATOR FREQUENCY CONTROL LOOP

[75] Inventor: Bertil Lyberg, Akersberga, Sweden

[73] Assignee: Telefonaktiebolaget L M Ericsson, Stockholm, Sweden

[21] Appl. No.: 690,145

[22] Filed: May 26, 1976

[30] Foreign Application Priority Data

June 17, 1975 Sweden .............................. 7506978

[51] Int. Cl.² .......................................... H03B 3/04
[52] U.S. Cl. .................................... 331/1 A; 331/17; 331/25
[58] Field of Search ..................... 331/1 A, 17, 18, 25

[56] References Cited
U.S. PATENT DOCUMENTS 3,484,712  12/1969  Foote et al. .................... 331/1 A X
3,551,826  12/1970  Sepe ................................ 331/1 A X Primary Examiner—Siegfried H. Grimm
Attorney, Agent, or Firm—Hane, Sullivan & Spiecens

[57] ABSTRACT

In an oscillator circuit controlled by a reference frequency a voltage regulated oscillator is controlled by the output voltage from digital-to-analog converter whose digital input is obtained from an up/down counter. The counter is controlled by the output from a frequency difference detector which compares the output of the voltage control oscillator and the reference frequency. A threshold circuit is connected between the frequency difference detector and the activation and up/down control inputs of the counter so that the counter is activated only when the frequency difference exceeds a predetermined amount.

2 Claims, 1 Drawing Figure

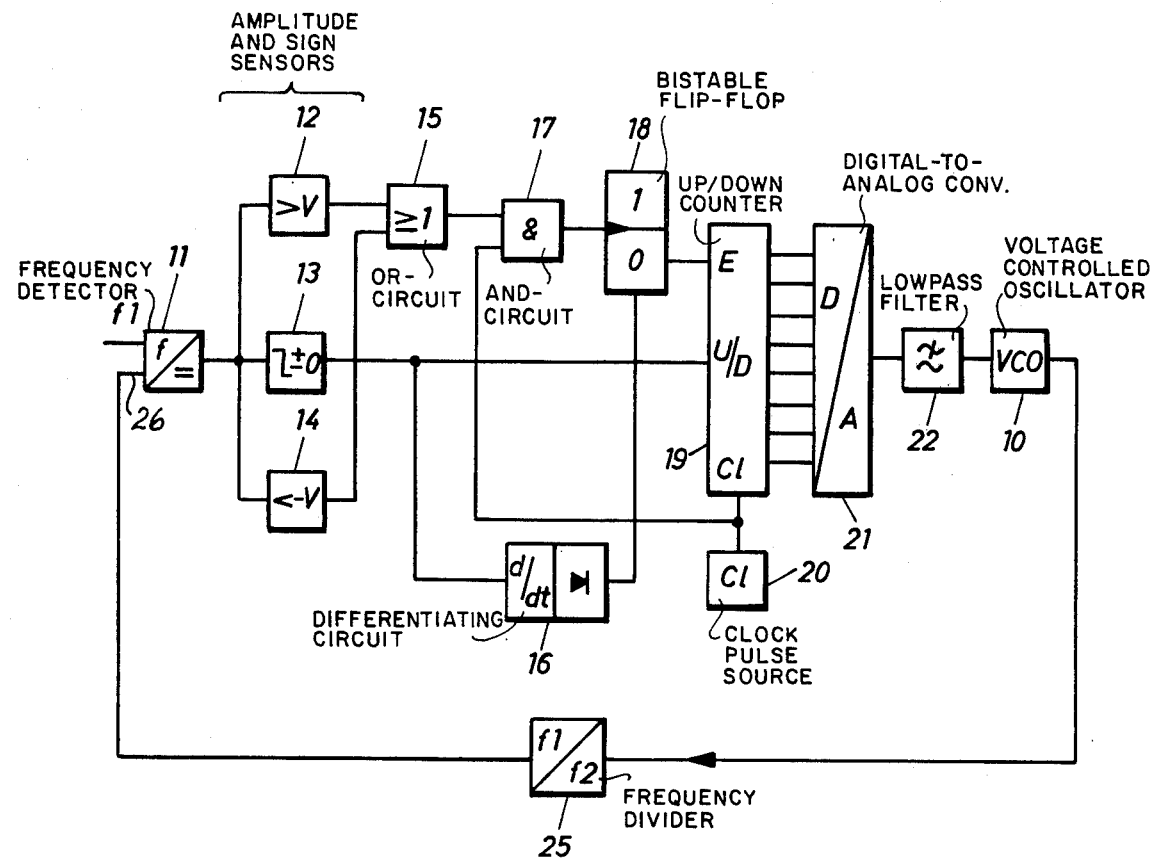

OSCILLATOR FREQUENCY CONTROL LOOP

The present invention relates to a circuit for controlling the frequency of an oscillator, particularly an oscillator included in a carrier frequency system.

In carrier frequency telecommunication systems it is a known problem to synchronize the main oscillators from which the different carrier frequencies are derived. With the great number of channels which are used in modern carrier frequency systems it is necessary that the different main oscillators included in such a system generate frequencies which are in accordance within very narrow limits. The usual manner for insuring synchronism is to use phase locked oscillators where the main oscillators are controlled by a control voltage which has been derived by means of a phase comparison between the oscillator voltage and a reference voltage. As soon as the phase is changed an adjustment of the oscillator frequency will thus take place. It is known by the Swedish Patent Application 7507745-4 to change the control voltage step by step by letting the control voltage when it exceeds a certain level step an up/down counter. The counter position is decoded and determines the control voltage applied to the voltage controlled oscillator. Even if the frequency difference between the reference voltage and the oscillator voltage is very small, however, a quantisized frequency jump will occur quite a number of times per hour. It can be observed that this occurs even if the demands called for regarding the frequency stability are fullfilled. Each such change gives rise to transient problems.

In all systems where a reference voltage controls a number of oscillators by means of phase locking an almost constant phase relation is obtained between the different oscillators included in a carrier frequency network. Thus unfavourable disturbance accumulations can arise on certain routes.

According to the invention the above disadvantages can be avoided when the frequency is adjusted only when it exceeds the stability limit required for the system. In this way unnecessary frequency adjustments of the oscillator and the subsequent frequency variations are avoided. Furthermore, random phase conditions are obtained in the network because the regulating voltage is not phase dependent.

The invention contemplates a frequency controlled oscillator as defined by the appended claims.

The invention will be described more in detail in connection to the accompanying drawing whose sole FIGURE shows a block diagram for an oscillator with frequency control in accordance with the invention.

In the Figure reference numeral 10 denotes a voltage controlled oscillator the control input of which is connected to a digital-to-analog converter 21 through a low-pass filter 22. The output of the oscillator is, possibly through a frequency divider 25 connected to an input 26 on a frequency detector 11 which has a second input connected to a reference voltage source f1. The frequency detector 11 is suitably of the type which is described in the published Swedish Patent Application 7500935-7 and which gives an output voltage which is proportional to the frequency deviation between the reference voltage and the oscillator voltage (or a fraction of that). The output of the frequency detector is connected to three amplitude sensing circuits of which two, 12 and 14 give output signal when the output voltage of the frequency detector 11 exceeds the positive or negative thresholds which mark that the frequency deviation cannot be tolerated. In the corresponding manner the circuit 13 senses if the output signal of the frequency detector is positive or negative. The outputs from the threshold circuits 12 and 14 are connected to an OR-circuit 15 the output of which is connected to the one input of an AND-circuit 17. The second input of the AND-circuit 17 is connected to a clock pulse source 20. The output from the AND-circuit 17 is connected to the trigger input of a bistable flip-flop 18. The complementary output of the flip-flop 18 is connected to the activation input E of an up/down counter 19. The output of the zero crossing circuit 13 is connected on the one hand to the input U/D for control of the stepping direction of the counter 19, and on the other hand to the differentiating circuit 16 which is provided with a full wave rectifier on the output. Each time the zero crossing circuit indicates sign change a pulse is therefore obtained which is fed into the zero setting input of the flip flop circuit 18 independent of in which directions the sign changes. The clock input C1 of the counter is connected to the clock pulse generator 20.

The outputs from the different stages of the counter 19 are connected to the inputs of a digital-to-analog converter 21 the analog output of which is connected to the voltage controlled control input of the oscillator 10 through a low pass filter 22.

The apparatus operates in the following manner assuming that the counter 19 in an initial state the flip-flop is zero-set and that the output voltage of the digital-to-analog converter lies within the controllable range of the voltage controlled oscillator 10. The frequency of the voltage controlled oscillator 10 which now is assumed to lie at its lowest limit value is divided in the divider 25 and is compared with the reference frequency f1 in the frequency comparator 11. As the oscillator frequency is too low relative the reference frequency it is assumed that the frequency comparator generates a negative voltage which is outside the tolerance limit -V for the allowed frequency deviation. The output of the circuit 13 and thus the input U/D of the counter 19 gets a low level and the counter is set to up-counting. The output from the threshold circuit 14 gets a high level and opens the AND-circuit 17 which passes a pulse during the next clock pulse and causing the flip-flop circuit 18 to be set to one. The complementary output on this and in this connection the input E on the counter 19 receives low level and the counter is activated. The clock pulses from source 20 now cause the counter to count upwards. Gradually as the contents of the counter increases, the output voltage from the digital to analog converter 21 and thus the control voltage of the oscillator also increases. When the frequency difference between the input signals to the frequency comparator 11 passes through zero, a voltage step is obtained from the circuit 13 which step after differentiating in the circuit 16 gives a zero-setting pulse to the flip-flop circuit 18. The counter 19 stops when the activation input E receives high level and the control voltage of the oscillator 10 remains at the value which corresponds to the stopped position of the counter.

The system will remain in this position as long as the oscillator 10 is stable. If, on the contrary, the frequency would drift away so far in one or the other direction for example because of a temperature change that the tolerance limit is exceeded, one of the threshold circuits 12 or 14 will again open the AND-circuit 17 and the counter 19 is again activated. The clock pulses step the counter in the direction which is determined by the output voltage from the circuit 13 until the frequency deviation has been corrected.

The invention can be modified in a number of ways within the scope of the invention. The counter can for example be replaced by a memory and a separate arithmetic circuit which adds or subtracts a unit to the contents of the memory for each clock pulse as long as the circuit is activated by the threshold circuits.

We claim:

1. An oscillator device comprising a voltage controlled oscillator having an output and a control input, a low-pass filter, a digital to analog converter having digital inputs and an analog output connected to said oscillator control input through said low-pass filter, a bidirectional counting means having digital outputs connected to the digital inputs on said digital-to-analog converter, said counting means comprising a clock pulse source, a clock pulse input connected to said pulse source, an activation input and an up/down control input for controlling the counting direction, frequency comparator means for comparing the frequency of a signal derived from the output of said voltage controlled oscillator and the frequency of a reference signal, said frequency comparator means generating a difference signal having an amplitude and sign which represent the difference between said signal and said reference signal, threshold means and sign indicating means sampling said difference signal for generating control signals to said activation input and said up/down control input respectively for enabling said clock pulse source to step said counting means in a compensating direction as the difference signal falls outside predetermined thresholds, and means for stopping the counter when the difference signal passes through a zero difference value.

2. An oscillator as claimed in claim 1 where said threshold means comprises trigger means connected to said activating input, amplitude sensing circuits for detecting when the difference signal exceeds an upper and a lower threshold for setting said trigger means and means for resetting said trigger means when the polarity of the difference signal changes sign.

* * * * *